(12) United States Patent
Bao et al.

(10) Patent No.: US 12,342,595 B2
(45) Date of Patent: Jun. 24, 2025

(54) TRANSISTOR CELL WITH SELF-ALIGNED GATE CONTACT

(71) Applicant: QUALCOMM Incorporated, San Diego, CA (US)

(72) Inventors: Junjing Bao, San Diego, CA (US); John Jianhong Zhu, San Diego, CA (US); Giridhar Nallapati, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 874 days.

(21) Appl. No.: 17/235,491

(22) Filed: Apr. 20, 2021

(65) Prior Publication Data
US 2022/0336607 A1    Oct. 20, 2022

(51) Int. Cl.
  *H10D 64/27* (2025.01)
  *H10D 64/01* (2025.01)
  (Continued)

(52) U.S. Cl.
  CPC ......... *H10D 64/512* (2025.01); *H10D 64/021* (2025.01); *H10D 64/251* (2025.01);
  (Continued)

(58) Field of Classification Search
  CPC ....... H01L 29/42356; H01L 21/823468; H01L 27/088; H01L 29/41725; H01L 29/42364; H01L 29/42372; H01L 29/6656; H01L 21/76897; H01L 27/0207; H01L 29/66545; H01L 29/66636; H01L 21/823475; H10D 64/512; H10D 64/021; H10D 64/251; H10D 64/514; H10D 64/517; H10D 84/0147; H10D 84/038; H10D 84/83; H10D 62/021; H10D 64/017; H10D 89/10; H10D 84/0149
  See application file for complete search history.

(56) References Cited

U.S. PATENT DOCUMENTS 8,536,040 B1 * 9/2013 Park ..................... H10D 64/66
                                                              257/E21.198
9,257,348 B2 * 2/2016 Xie ...................... H10D 64/021
(Continued)

FOREIGN PATENT DOCUMENTS

ID    P202307675 A  *  3/2022  ........... H01L 21/768

OTHER PUBLICATIONS

Ferrell et al., "Materials Technology Co-optimization of Self-Aligned Gate Contact for Advanced CMOS Technology Nodes", IEEE, Applied Materials Inc., Santa Clara, California, USA, 2020, 2 Pages.
(Continued)

*Primary Examiner* — Maliheh Malek
(74) *Attorney, Agent, or Firm* — Muncy, Geissler, Oids & Lowe, P.C./Qualcomm Incorporated

(57) ABSTRACT

Disclosed are apparatuses including a transistor cell and methods of fabricating the transistor cell. The transistor cell may include a substrate, an active region and a gate having a gate contact in the active region. The transistor cell may further include a first portion of a spacer of the gate contact formed from a first material, and a second portion of the spacer of the gate contact formed from a second material.

13 Claims, 10 Drawing Sheets

(51) Int. Cl.
*H10D 64/23* (2025.01)
*H10D 84/01* (2025.01)
*H10D 84/03* (2025.01)
*H10D 84/83* (2025.01)

(52) U.S. Cl.
CPC ......... *H10D 64/514* (2025.01); *H10D 64/517* (2025.01); *H10D 84/0147* (2025.01); *H10D 84/038* (2025.01); *H10D 84/83* (2025.01)

(56) References Cited

U.S. PATENT DOCUMENTS

| | | | | |
|---|---|---|---|---|
| 9,530,863 | B1* | 12/2016 | Zhang | H10D 30/025 |
| 9,530,866 | B1* | 12/2016 | Zhang | H10D 30/6735 |
| 9,530,887 | B1* | 12/2016 | Chang | H10D 30/6217 |
| 9,905,671 | B2* | 2/2018 | Cheng | H01L 21/02178 |
| 10,014,370 | B1* | 7/2018 | Xie | H10D 64/017 |
| 10,229,985 | B1* | 3/2019 | Li | H10D 62/116 |
| 10,770,464 | B2* | 9/2020 | Liu | H01L 23/53295 |
| 10,777,642 | B2* | 9/2020 | Hong | H10D 30/6731 |
| 10,825,897 | B2* | 11/2020 | Hong | H10D 30/024 |
| 11,183,592 | B2* | 11/2021 | Liao | H10D 30/027 |
| 11,271,106 | B2* | 3/2022 | Bao | H10D 30/63 |
| 11,443,984 | B2* | 9/2022 | Chen | H10D 64/021 |
| 11,769,819 | B2* | 9/2023 | Wu | H10D 64/015 257/288 |
| 2003/0178688 | A1* | 9/2003 | Yang | H10B 12/0335 257/E21.507 |
| 2012/0049247 | A1* | 3/2012 | Lee | H01L 21/28114 257/288 |
| 2014/0124841 | A1* | 5/2014 | Xie | H10D 64/017 257/288 |
| 2014/0264490 | A1* | 9/2014 | Ponoth | H01L 21/28008 438/300 |
| 2015/0145073 | A1* | 5/2015 | Lee | H01L 21/28247 257/411 |
| 2015/0333148 | A1* | 11/2015 | Koo | H01L 21/768 257/288 |
| 2016/0005822 | A1* | 1/2016 | Song | H01L 21/76885 257/288 |
| 2017/0170291 | A1* | 6/2017 | Mulfinger | H10D 62/151 |
| 2017/0186849 | A1* | 6/2017 | Chen | H01L 21/76897 |
| 2017/0288056 | A1* | 10/2017 | Balakrishnan | H01L 21/02381 |
| 2018/0006128 | A1* | 1/2018 | Cheng | H10D 64/679 |
| 2018/0053847 | A1* | 2/2018 | Balakrishnan | H10D 84/038 |
| 2018/0083136 | A1* | 3/2018 | Xie | H10D 64/252 |
| 2018/0254331 | A1* | 9/2018 | Xie | H01L 21/31116 |
| 2018/0374927 | A1* | 12/2018 | Liu | H10D 64/518 |
| 2019/0027586 | A1* | 1/2019 | Zang | H10D 64/021 |
| 2019/0326165 | A1* | 10/2019 | Xie | H10D 84/0149 |
| 2019/0393321 | A1* | 12/2019 | Xu | H10D 64/015 |
| 2020/0006062 | A1* | 1/2020 | Jhan | H01L 21/31155 |
| 2020/0020770 | A1* | 1/2020 | Qi | H10D 84/0147 |
| 2020/0035804 | A1* | 1/2020 | Chen | H10D 30/024 |
| 2020/0066903 | A1* | 2/2020 | Bao | H10D 84/0195 |
| 2020/0098886 | A1* | 3/2020 | Liu | H10D 64/015 |
| 2020/0411377 | A1* | 12/2020 | Chen | H01L 21/76883 |
| 2021/0057581 | A1* | 2/2021 | Lin | H10D 30/6211 |
| 2021/0119015 | A1* | 4/2021 | Wu | H01L 21/26586 |
| 2022/0037194 | A1* | 2/2022 | Li | H10D 84/038 |
| 2022/0352347 | A1* | 11/2022 | Bao | H01L 21/76805 |
| 2022/0384260 | A1* | 12/2022 | Chen | H10D 64/017 |
| 2022/0392800 | A1* | 12/2022 | Lim | H01L 21/76877 |
| 2023/0078700 | A1* | 3/2023 | Lu | H10D 84/0193 257/369 |
| 2024/0096964 | A1* | 3/2024 | Bao | H10D 30/797 |
| 2024/0258387 | A1* | 8/2024 | Siao | H10D 84/038 |

OTHER PUBLICATIONS

International Search Report and Written Opinion—PCT/US2022/071316—ISA/EPO—Jul. 19, 2022.

* cited by examiner

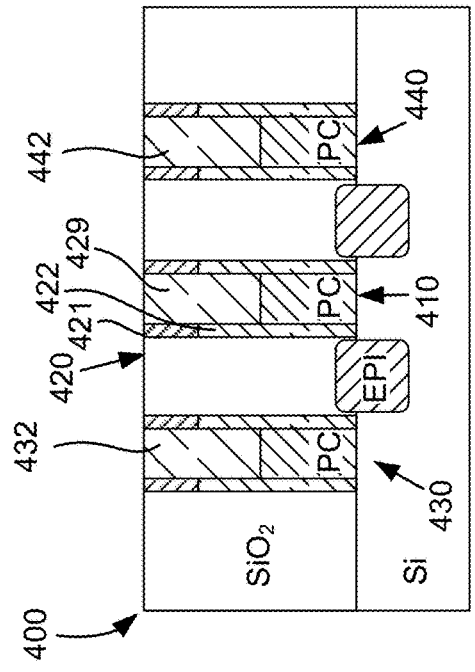
FIG. 4E
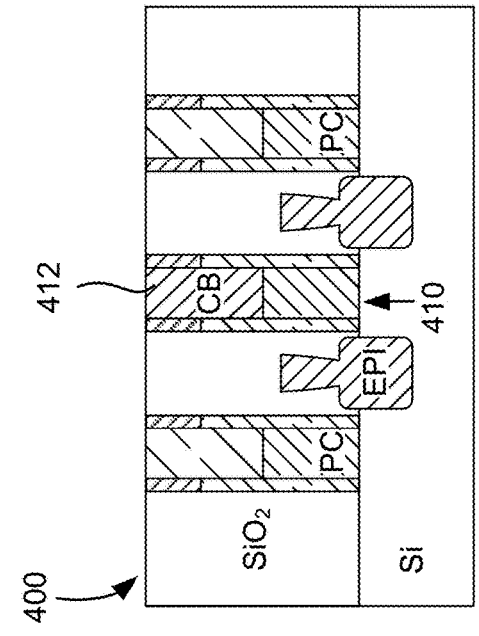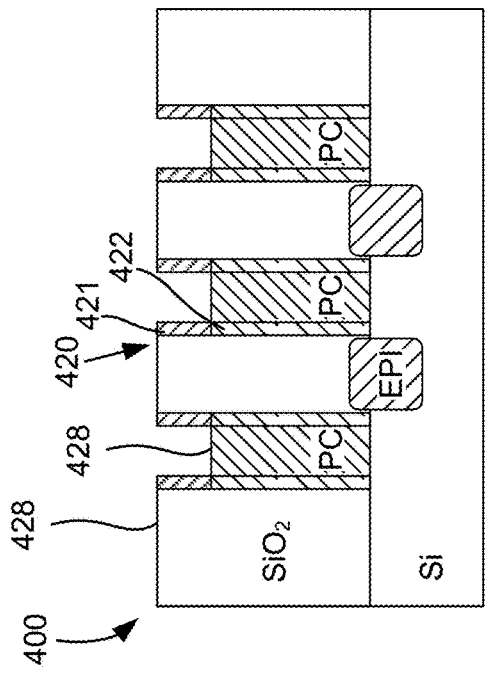
FIG. 4F
FIG. 4G
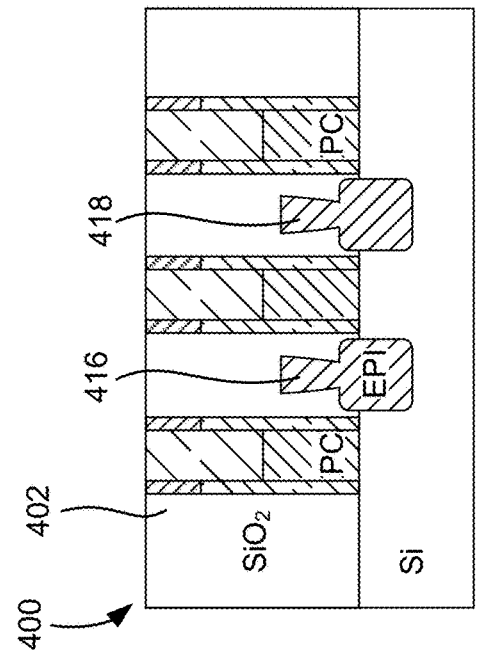
FIG. 4H

TRANSISTOR CELL WITH SELF-ALIGNED GATE CONTACT

FIELD OF DISCLOSURE

Aspects of this disclosure relates generally to integrated circuit (IC) packages, and more specifically, but not exclusively, to the improved manufacture of device contacts, including transistor cells with self-aligned gate contacts (SAGC).

BACKGROUND

The operation of devices (e.g., transistors, capacitors, resistors, etc.) on a semiconductor or silicon substrate are supported by the electrical contacts and pathways to these devices and their operational or active regions. Metal Oxide Semiconductor (MOS) transistor devices are widely used in the manufacture of integrated circuits. MOS transistors comprise various components, such as source and drain regions, diffusion regions, gate electrodes, gate dielectric layers, etc.

As integrated circuit technologies scale down, a problem that may occur during the fabrication of these devices is the unintentional formation of various shorting pathways (because of the smaller and tighter dimensional tolerances that can be shorted across), such as a contact to gate short for example. Some typical solutions used to address these problems are the selective choosing of reduced registration parameters or by altering the device dimensions and geometries to mitigate these shorting pathways. As pitch dimensions and sizes become smaller and smaller, adjusting these dimensions to make them further apart (thereby harder to short across the reduced dimensions), becomes more and more impractical as a design technique to mitigate or eliminate these issues.

As a specific example, when manufacturing Metal Oxide Semiconductor (MOS) transistor devices, it is an important design objective to ensure that gate contacts are not electrically short circuited (shorted) to other active regions within an area, such as a source/drain region. This can cause electrical malfunctions, degraded/erratic performance, and permanent physical damage to the device.

Accordingly, there is a need for devices and methods that overcome the deficiencies and shortcoming of the conventional approaches, including the devices and methods, provided herein.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In accordance with the various aspects disclosed herein, at least one aspect includes, an apparatus including a transistor cell. The transistor cell may include a substrate; an active region; a gate having a gate contact in the active region; a first portion of a spacer of the gate contact formed from a first material; and a second portion of the spacer of the gate contact formed from a second material.

In accordance with the various aspects disclosed herein, at least one aspect includes a method for fabricating a transistor cell, which may include forming a gate on a substrate; forming a gate contact in an active region of the transistor cell; forming a first portion of a spacer of the gate contact from a first material; and forming a second portion of the spacer of the gate contact from a second material.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which:

FIGS. 4A-4H illustrates portions of a fabrication process for the formation of the transistor cell of FIG. 2 in accordance with at least one aspect of the disclosure.

Figure 1:
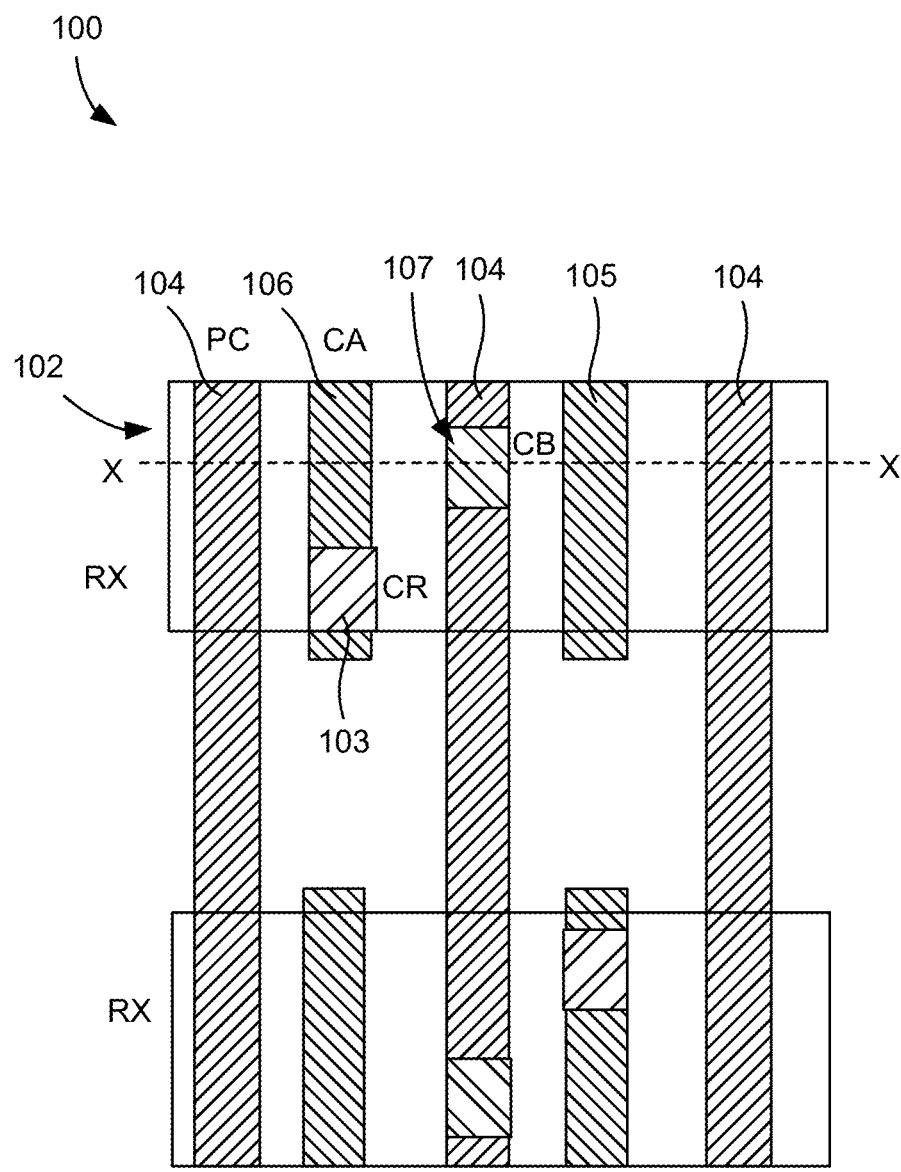
FIG. 1 illustrates a transistor cell in accordance with at least one aspect of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific aspects. Alternate aspects may be devised without departing from the scope of the teachings herein. Additionally, well-known elements of the illustrative aspects herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary aspects. In such instances, internal details of the known, conventional component structures and/or portions of operations may be omitted to help avoid potential obfuscation of the concepts illustrated in the illustrative aspects disclosed herein.

The terminology used herein is for the purpose of describing particular aspects only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

FIG. 1 is an illustration of a partial top view of a transistor cell 100 in accordance with at least one aspect of the disclosure. In general, a transistor cell includes a substrate, an active region, and a gate having a contact in the active region. Additionally, a first portion of a spacer of the gate contact is formed from a first material and a second portion of a spacer of the gate contact is formed from a second material. This will be discussed in greater detail below. Those skilled in the art will appreciate that many different materials and material combinations may be implemented. In one aspect, highly selective materials and materials possessing low-k dielectric properties may be used. Additionally, those skilled in the art will also appreciate the number of spacers used, may also vary in number, depending on the final application and design objectives sought.

As illustrated in FIG. 1, a diffusion region 102 of the transistor cell includes a gate 104, which may be formed of polysilicon or other suitable material. The gate includes a gate contact 107 in the diffusion region 102. Adjacent to the gate 104 and gate contact 107 are source/drain contacts 105 and 106. It will be appreciated that the configuration of 105 or 106 of the source or drain is based on the specific design and doping of the material. A connection point 103 may be provided to couple the source/drain contact 105

Figure 2:
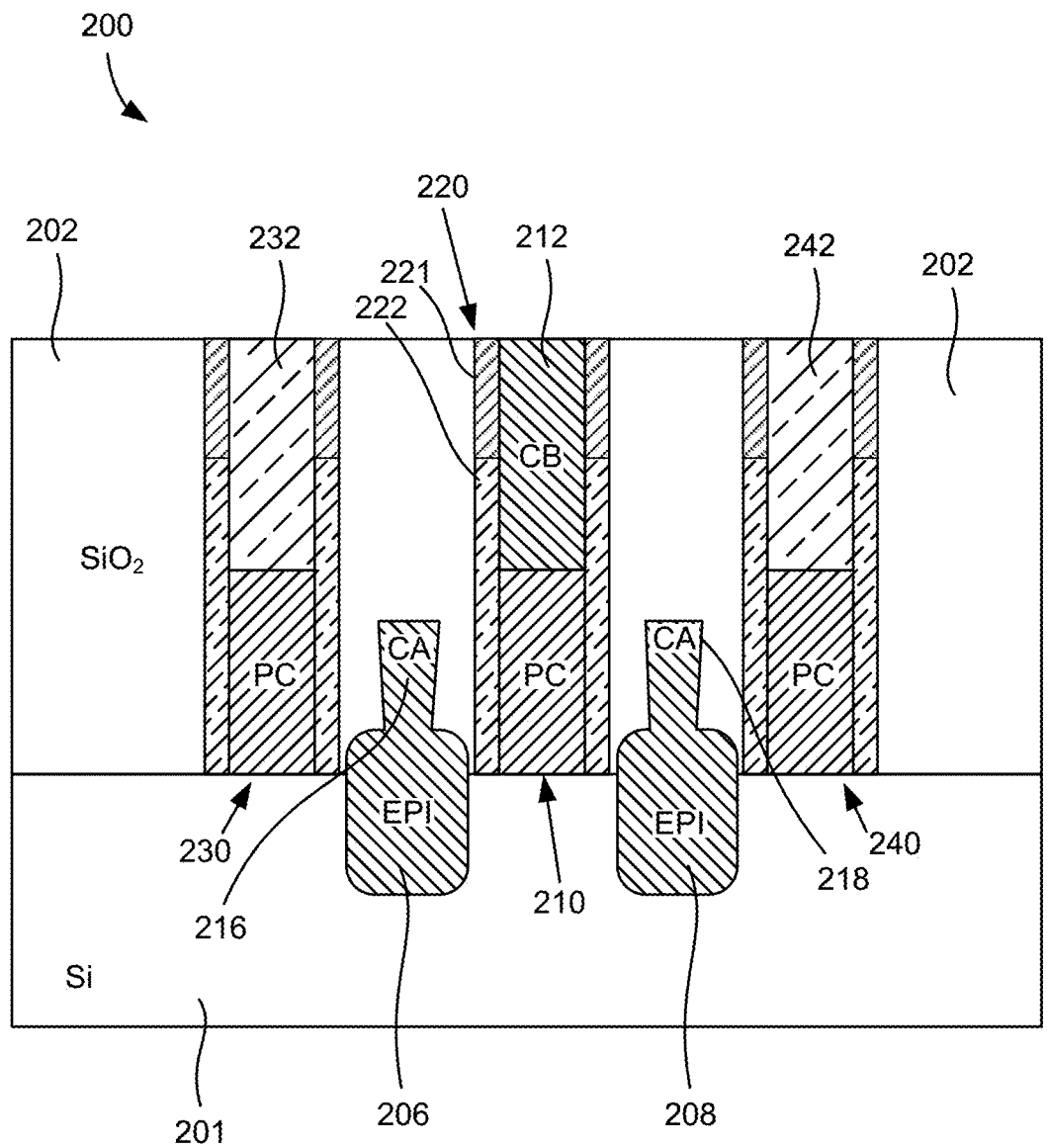
FIG. 2 is an illustration of a partial cross-sectional view of a transistor cell in accordance with at least one aspect of the disclosure.

FIG. 2 is an illustration of a partial cross-sectional view of a transistor cell 200 in accordance with at least one aspect of the disclosure. The cross-sectional view is for a portion at X-X, such as illustrated in FIG. 1. The transistor cell 200 includes a substrate 201, which may be formed of Silicon (Si), Silicon doped with boron or phosphorous or any other suitable material. A gate 210 includes a gate contact 212, which is formed in the active region of transistor cell 200, which is not specifically illustrated in this view (e.g., diffusion region 102 at X-X in FIG. 1). A first portion 221 of a spacer 220 of the gate contact 212 can be formed from a highly selective material (HSM). In one aspect, the HSM is highly selective relative to a material such as Silicon Nitride (SiN) for example.

In some aspects, the HSM may be Aluminum Oxide (AlOx), Aluminum Nitride (AlN), Titanium Oxide (TiOx), (Titanium Nitride) TiN, and Silicon Carbide (SiC), or any combination or mixture of these materials. It will be appreciated that the various aspects disclosed are not limited to these materials and other highly selective materials may also be used. As used herein, the material is highly selective in terms of the resisting and forming a boundary guide for the base contact (CB) etch. It will be appreciated that this constraint of the base contact etch also allows for a self-aligned gate contact, as the alignment is provided by the channel formed by the highly selective material. The various aspects disclosed also significantly reduce the danger of a gate contact to source/base contact short occurring or other shorting pathways to the gate contact, by providing an insulating barrier and constraining the base contact etch process and deposition of metal in the base contact.

A second portion 222 of the spacer 220 of the gate 210 and gate contact 212 can be formed from a low k dielectric material. In some aspects, the low k dielectric material may be silicon oxycarbide (SiOC) or silicon boron carbon nitride (SiBCN) deposited by chemical vapor deposition (CVD) or atomic layer deposition (ALD). The transistor cell 200 also includes a source region 206 having a source contact 216 and a drain region 208 having a drain contact 218. The source contact 216 and drain contact 218 are adjacent the gate contact 212 and on opposite sides of the gate contact. As noted above, it will be appreciated that the configuration of the source or drain is based on the specific design and doping of the material. Accordingly, it will be appreciated that the source region 206 and drain region 208 references are merely provided for convenience of explanation and the source and drain regions may be formed by an epitaxial growth process (epi) may be configured as either source or drain based on the various design configurations. Accordingly, the various aspects disclosed are not limited to the specific illustrations provided. An insulation layer 202 is disposed on the substrate 201, including between the spacer 220 and the source contact 216, and between the spacer 220 and the drain contact 218. In some aspects, the insulation layer may be Silicon Dioxide ($SiO_2$). In some aspects, the gate contact, source contact and drain contact may be cobalt (Co) or tungsten (W). Additional gate 230 and gate 240 are on opposite sides of gate 210. The structure of the gates are similar, however, gates 230 and 240 do not have gate contacts in this cross-sectional portion. Instead, the gate 230 has a cap 232 disposed over the gate 230. Likewise, the gate 240 has a cap 242 disposed over the gate 240. In some aspects, the gate caps 232 and 242 may be SiN. Additionally, it will be appreciated the spacer of each gate has a similar structure, with a first portion HSM and a second portion that is formed form a low-k material. An alternative configuration will be discussed below.

Figure 3:
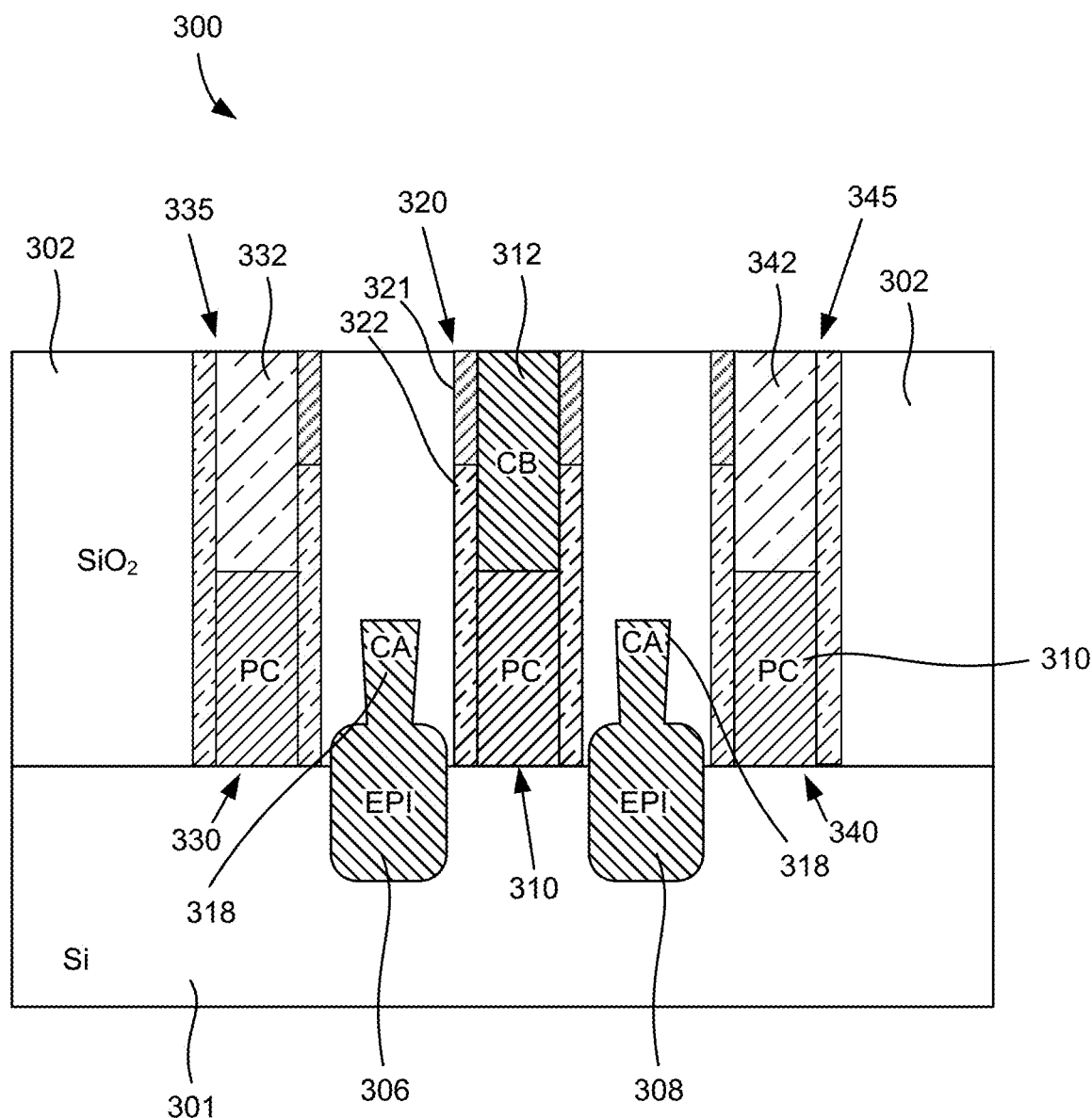
FIG. 3 is an illustration of a partial cross-sectional view of a transistor cell in accordance with at least one aspect of the disclosure.

FIG. 3 is an illustration of a partial cross-sectional view of a transistor cell 300 in accordance with at least one aspect of the disclosure. The cross-sectional view is for a portion at X-X, such as illustrated in FIG. 1. The transistor cell 300 is similar to the previously discussed aspects, except the spacers 335 and 345 includes the highly selective material (HSM) that is applied only on respective portions of the spacer 335 and 345 sidewall facing the gate contact 312. The transistor cell 300 includes a substrate 301, which may be formed of silicon (Si), silicon doped with boron or phosphorous or any other suitable material. A gate 310 includes a gate contact 312, which is formed in the active region of transistor cell 300, which is not specifically illustrated in this view (e.g., diffusion region 102 at X-X in FIG. 1). A first portion 321 of a spacer 320 of the gate contact 312 can be formed from a highly selective material (HSM). In some aspects, the HSM may be Aluminum Oxide (AlOx), Aluminum Nitride (AlN), Titanium Oxide (TiOx), (Titanium Nitride) TiN, and Silicon Carbide (SiC), or any combination or mixture of these materials. It will be appreciated that the various aspects disclosed are not limited to these materials and other highly selective materials may also be used. As used herein, the material is highly selective in terms of the resisting and forming a boundary guide for the base contact (CB) etch. It will be appreciated that this constraint of the base contact etch also allows for a self-aligned gate contact. The various aspects disclosed significantly reduce the danger of a gate contact to source/base contact short occurring or other shorting pathways to the gate contact, as discussed herein.

A second portion 322 of the spacer 320 of the gate 310 and gate contact 312 can be formed from a low k dielectric material. In some aspects, the low k dielectric material may be silicon oxycarbide (SiOC). The transistor cell 300 also includes a source region 306 having a source contact 316 and a drain region 308 having a drain contact 318. The source contact 316 and drain contact 318 are adjacent the gate contact 312 and on opposite sides of the gate contact. As noted above, it will be appreciated that the configuration of the source or drain is based on the specific design and doping of the material. Accordingly, it will be appreciated that the source region 306 and drain region 308 references are merely for convenience of explanation. The source and drain regions may be formed by an epitaxial growth process (epi) and may be configured as either source or drain based on the various design configurations. Accordingly, the various aspects disclosed are not limited to the specific illustrations provided. An insulation layer 302 is disposed on the substrate 301, including between the spacer 320 and the source contact 316, and between the spacer 320 and the drain contact 318. In some aspects, the insulation layer may be Silicon Dioxide ($SiO_2$). In some aspects, the gate contact, source contact and drain contact may be cobalt (Co) or tungsten (W). Additional gate 330 and gate 340 are on opposite sides of gate 310. The structures of the gates are similar, however, gates 330 and 340 do not have gate contacts in this cross-sectional portion. Instead, the gate 330 has a cap 332 disposed over the gate 330. Likewise, the gate 340 has a cap 342 disposed over the gate 340. In some aspects, the gate caps 332 and 342 may be SiN.

FIGS. 4A-4H illustrate various portions of a process to manufacture a transistor cell in accordance with at least one aspect of the disclosure. It will be appreciated that the following process produces a transistor cell 400 that is similar to that in FIG. 2. Various conventional processing and details of each processing stage, which are known, are not provided for brevity and to focus on the various aspects disclosed herein.

Figure 4A:
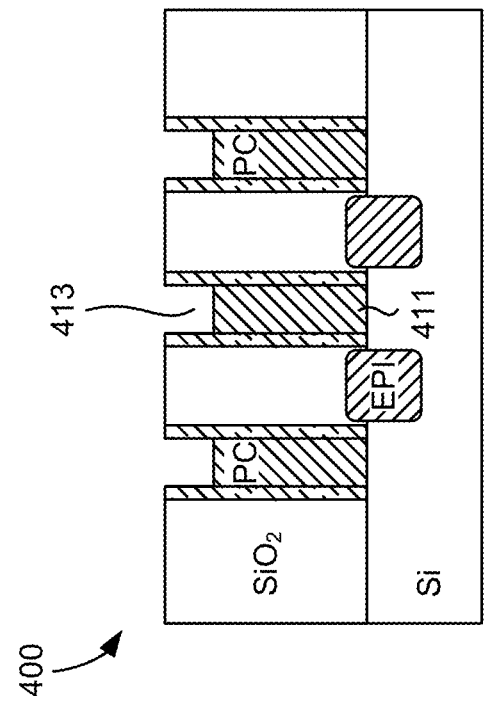

FIG. 4A illustrates the formation of the transistor cell 400 including a replacement metal gate (RMG) process. The process illustration begins with the transistor cell 400 having an insulation layer 402 (e.g., $SiO_2$), substrate 401, as well as a source/drain region 406 which may be formed by an epitaxial growth process and a source/drain region 408 which may be formed by an epitaxial growth process. As noted above, whether a source/drain regions 406 or 408 are configured as a source or drain is determined by design considerations. Accordingly, for the following description the term "source/drain" will be used to indicate either can be formed. A gate 410 includes a gate poly 411 which is disposed between a spacer 420, which at this stage is just a low-k material. Gate 410 is formed by sequential deposition of high k material (e.g., Hafnium Oxide ($HfO_2$), Zirconium dioxide ($ZrO_2$) and metal (e.g., TiN, Ti, W).

In the remaining FIGS. 4B to 4H all elements may not be labeled or addresses for brevity and to focus on the new aspects referenced in relation to that portion of the process.

Figure 4B:
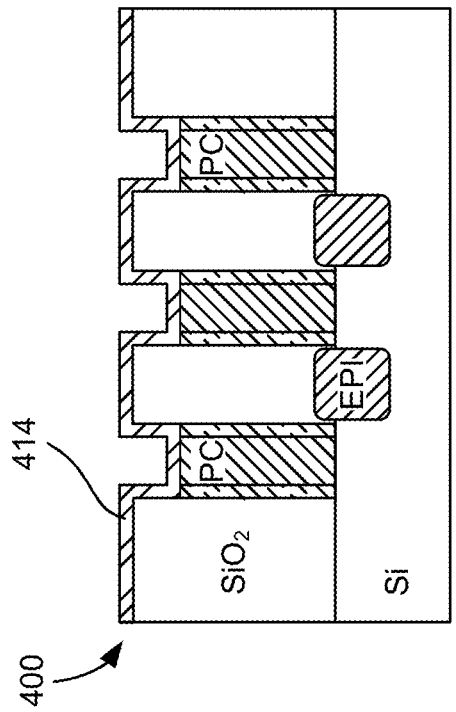

In FIG. 4B, the process for fabricating the transistor cell 400 continues with a gate recess process that forms a gate recess 413. In some aspects, an etching process may be used to partially removes the gate poly 411 (and adjacent gate ploys) on the top to a depth of about 10 nm-20 nm.

Figure 4C:
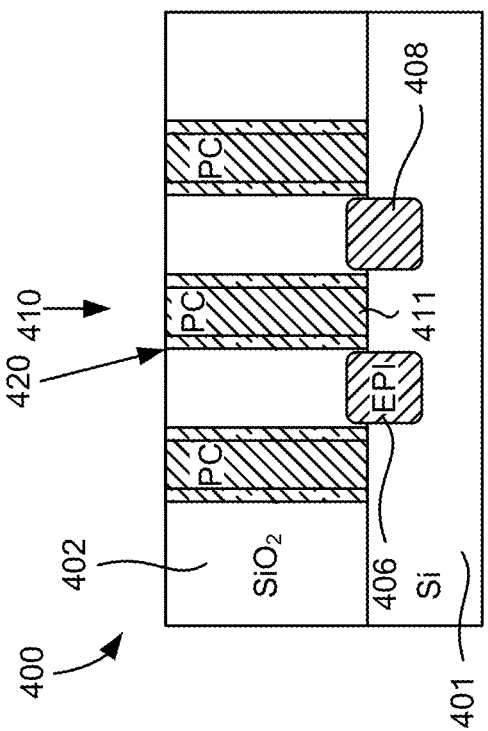

In FIG. 4C, the process for fabricating the transistor cell 400 continues with an isotropic etch process being used to remove a portion of the spacer 420, specifically etching away a portion of the low-k material of spacer 420. As illustrated, the etching recesses the low-k material of spacer 420 to approximately the same level as the gate poly 411, which in some aspects, is recessed to a depth of about 10 nm-20 nm.

Figure 4D:
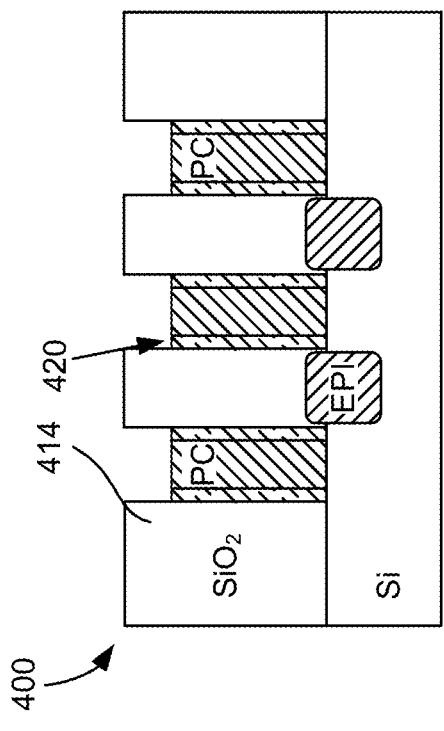

In FIG. 4D, the process continues for fabricating the transistor cell 400 with the depositing of a highly selective material 414. As noted above, in some aspects the highly selective material 414 may be AlOx, AlN, TiOx, TiN, SiC or a combination of these materials. The highly selective material 414 has a thickness generally equal to the low-k spacer material (e.g., 5 nm-15 nm) and a height about half of a gate cap height (e.g., 10 nm-20 nm). The gate cap is not illustrated at this stage of processing. In some aspects, conformal atomic layer deposition (ALD) may be used for depositing the highly selective material 414. However, it will be appreciated that other deposition techniques may be used, and the various aspects disclosed are not limited to a specific deposition process.

In FIG. 4E, the process for fabricating the transistor cell 400 continues with an etching process to remove the highly selective material on the horizontal surfaces 428. It will be appreciated that the etching process leaves the spacer 420 with a first portion 421 formed of the highly selective material and the second portion 422 formed of the low-k material. The etching can be performed as an anisotropic etch. However, it will be appreciated that any suitable etching technique may be used.

In FIG. 4F, the process for fabricating the transistor cell 400 continues with a further gate recess process. The gates are recessed below the first portion 421 of the spacer 420 so the recess extends into the second portion 422 of the spacer 420. In some aspects, this additional recess can be a height about half of the cap height (e.g., 10 nm-20 nm). The recesses are then filled with a cap material, such as SiN, forming cap 429 for gate 410, cap 432 for gate 430, and cap 442 for gate 440. The gate cap SiN is formed by chemical vapor deposition or atomic layer deposition followed by chemical mechanical polishing (CMP).

In FIG. 4G, the process for fabricating the transistor cell 400 continues with the source/drain contact 416 and source/drain contact 418 formation. The insulation layer 402 is patterned and etched to form openings for the source/drain contact 416 and source/drain contact 418. The openings can be filled with a conductive material, such as a metal (e.g., Co, W, etc.), followed by CMP, and then recessing and filling the recess with an insulation material (e.g., $SiO_2$) to form the source/drain contact 416 and source/drain contact 418 in some areas.

In FIG. 4H, the process for fabricating the transistor cell 400 continues with the gate contact 412 formation. The gate cap in the gate 410 is etched to provide a recess for the gate contact 412. The recess is filled with a conductive material, such as a metal (e.g., Co, W, etc.) and then CMP is performed to planarize the top surface of the gate contact 412 and the transistor cell 400. After this process, it will be appreciated that the transistor cell 400 is substantially similar to transistor cell 200. Accordingly, relabeling and detailing of the various similar elements previously introduced in the foregoing will not be provided to avoid redundancy.

FIGS. 5A-5H illustrate various portions of a process to manufacture a transistor cell in accordance with at least one aspect of the disclosure. It will be appreciated that the following process produces a transistor cell 500 that is similar to that in FIG. 3. Various conventional processing and details of each processing stage, which are known, are not provided for brevity and to focus on the various aspects disclosed herein.

Figure 5A:
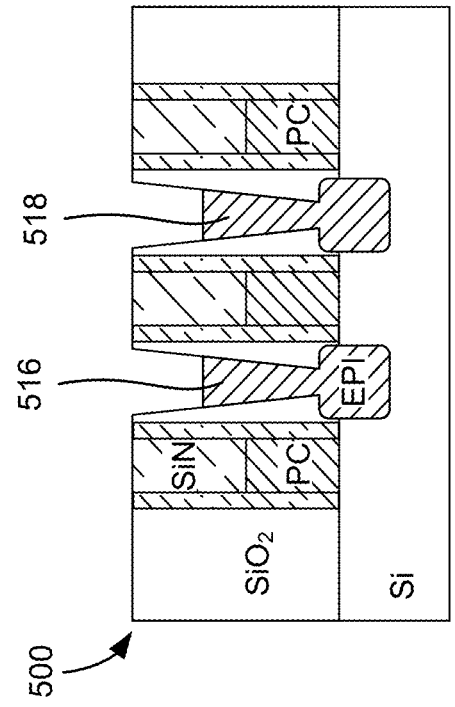
FIGS. 5A-5H illustrates portions of a fabrication process for the formation of the transistor cell of FIG. 3 in accordance with at least one aspect of the disclosure.

FIG. 5A illustrates the formation of the transistor cell 500 including a replacement metal gate (RMG) process. The process illustration begins with an insulation layer 502 (e.g., Silicon Dioxide ($SiO_2$)), substrate 501, as well as a source/drain region 506 which may be formed by an epitaxial growth process and a source/drain region 508 which may be formed by an epitaxial growth process. Source/drain contact 516 (CA) and source/drain contact 518 (CA) have been patterned, filled with conductive material, such as a metal (e.g., Co, W, etc.) and had a CMP process performed. A gate 510 includes a gate poly 511 which is disposed between a spacer 520, which at this stage is just a low-k material. A gate cap 529 (e.g., SiN) is disposed on the gate poly 511. Gate 530 and Gate 540 are configured similar to gate 510.

It will be appreciated that in the remaining FIGS. 5B to 5H all elements may not be labeled or addresses for brevity and to focus on the new aspects referenced in relation to that portion of the process.

Figure 5B:
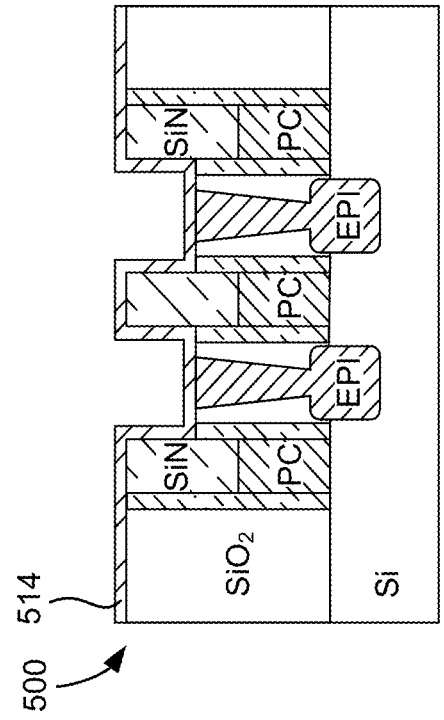

In FIG. 5B, the process for fabricating the transistor cell 500 continues with a partial recess of source/drain contact 516 and source/drain contact 518. The partial recess can be performed by a dry plasma etch process or other suitable process depending on the material to be etched. In some aspects, the partial recess may have a depth of 10 nm-20 nm.

Figure 5C:
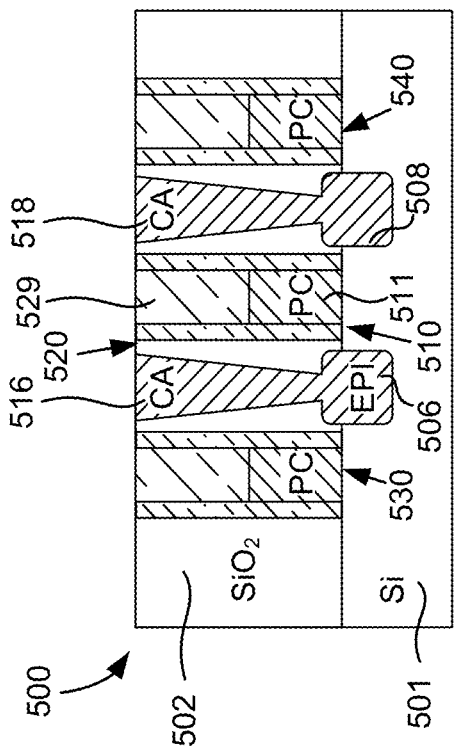

In FIG. 5C, the process for fabricating the transistor cell 500 continues with an etching process being used to remove a portion of the spacer 520, portions of the insulation layer 502 between the gates 510, 530 and 540 and adjacent portions of spacer 535 of gate 530 and spacer 545 of gate 540 that face the gate 510. The etching may be performed by an isotropic plasma etch process. As illustrated, the etching recesses the low-k material of spacer 520, spacer 535 and spacer 545 to expose portions of the gate caps 529, 532 and 542. The etching may recess the etched portion to a depth of about 10 nm-20 nm.

Figure 5D:
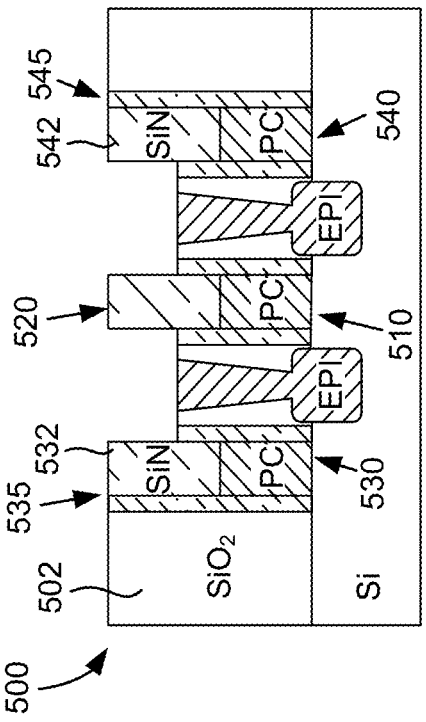

In FIG. 5D, the process for fabricating the transistor cell 500 continues with the depositing of a highly selective material 514. As noted above, in some aspects the highly selective material 514 may be AlOx, AlN, TiOx, TiN, SiC or a combination of these materials. The highly selective material 514 has a thickness generally equal to low-k spacer material (e.g., 5 nm-15 nm) and a height about half of the gate cap 529 height (e.g., 10 nm-20 nm). In some aspects conformal atomic layer deposition (ALD) may be used for depositing the highly selective material 514. However, it will be appreciated that other deposition techniques may be used.

Figure 5E:
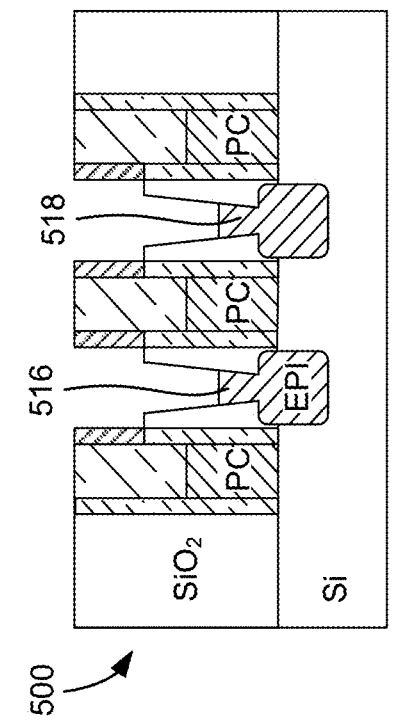

In FIG. 5E, the process for fabricating the transistor cell 500 continues with an etching process to remove to remove the highly selective material on the horizontal surfaces 528. It will be appreciated that the etching process leaves the spacer 520 with a first portion 521 formed of the highly selective material and the second portion 522 formed of the low-k material. The etching can be performed as an anisotropic etch. However, it will be appreciated that any suitable etching technique may be used. Additionally, it will be appreciated that spacer 535 and has a first portion 531 formed of the highly selective material and the second portion 536 formed of the low-k material on a sidewall facing the spacer 520 and the sidewall 537 opposite the spacer 520 does not have a portion formed from the highly selective material. Likewise, spacer 545 and has a first portion 541 formed of the highly selective material and the second portion 546 formed of the low-k material on a sidewall facing the spacer 520 and the sidewall 547 opposite the spacer 520 does not have a portion formed from the highly selective material.

Figure 5F:
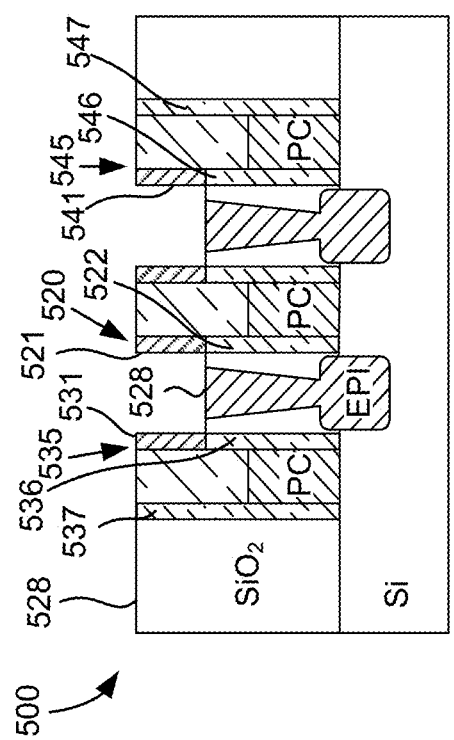

In FIG. 5F, the process for fabricating the transistor cell 500 continues with a further source/drain contact 516 and source/drain contact 518 recess process. The source/drain contact 516 and source/drain contact 518 are recessed to a target level (e.g., below the gate caps). In one example, this recess depth can range from 10 to 20 nm. The further recess of the source/drain contact 516 and source/drain contact 518 can be performed by a dry plasma etch process or any other suitable process. Further, the final target level may be determined differently for different designs and the various aspects disclosed herein are not limited to the illustrated examples provided in the accompanying drawings.

Figure 5G:
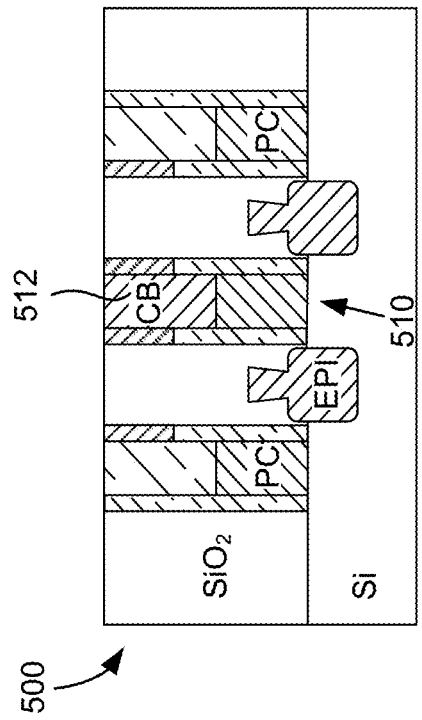

In FIG. 5G, the process for fabricating the transistor cell 500 continues with the source/drain contact 516 and source/drain contact 518 being covered by an insulation material (e.g., $SiO_2$) forming part of insulation layer 502. The insulation layer 502 may be $SiO_2$ or other similar insulator/dielectric material.

Figure 5H:
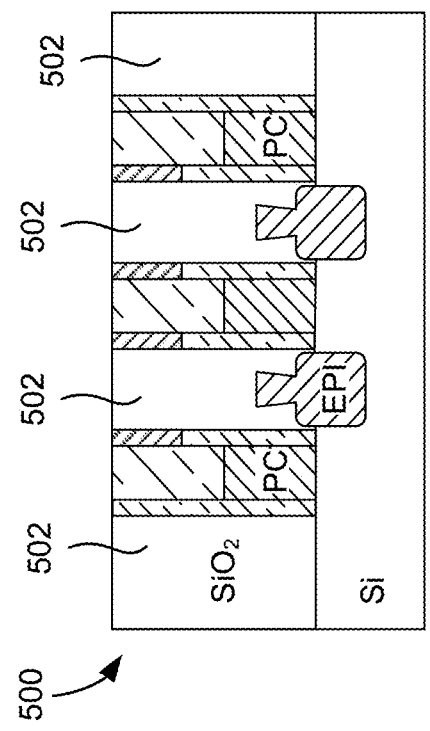

In FIG. 5H, the process for fabricating the transistor cell 500 continues with the gate contact 512 formation. The gate cap of gate 510 in the contact region is etched to provide a recess for the gate contact 512. The recess is filled with a conductive material, such as a metal (e.g., Co, W, etc.) and then CMP is performed to planarize the top surface of the gate contact 512 and the transistor cell 500. After this process, it will be appreciated that the transistor cell 500 is substantially similar to transistor cell 300. Accordingly, relabeling and detailing of the various similar elements previously introduced in the foregoing will not be provided to avoid redundancy.

It will be appreciated from the foregoing that there are various methods for fabricating devices including the transistor cells disclosed herein. The various process blocks are provided as overall functionalities and are not necessarily provided or limited to any specific processing order that may be used in a given fabrication process.

Figure 6:
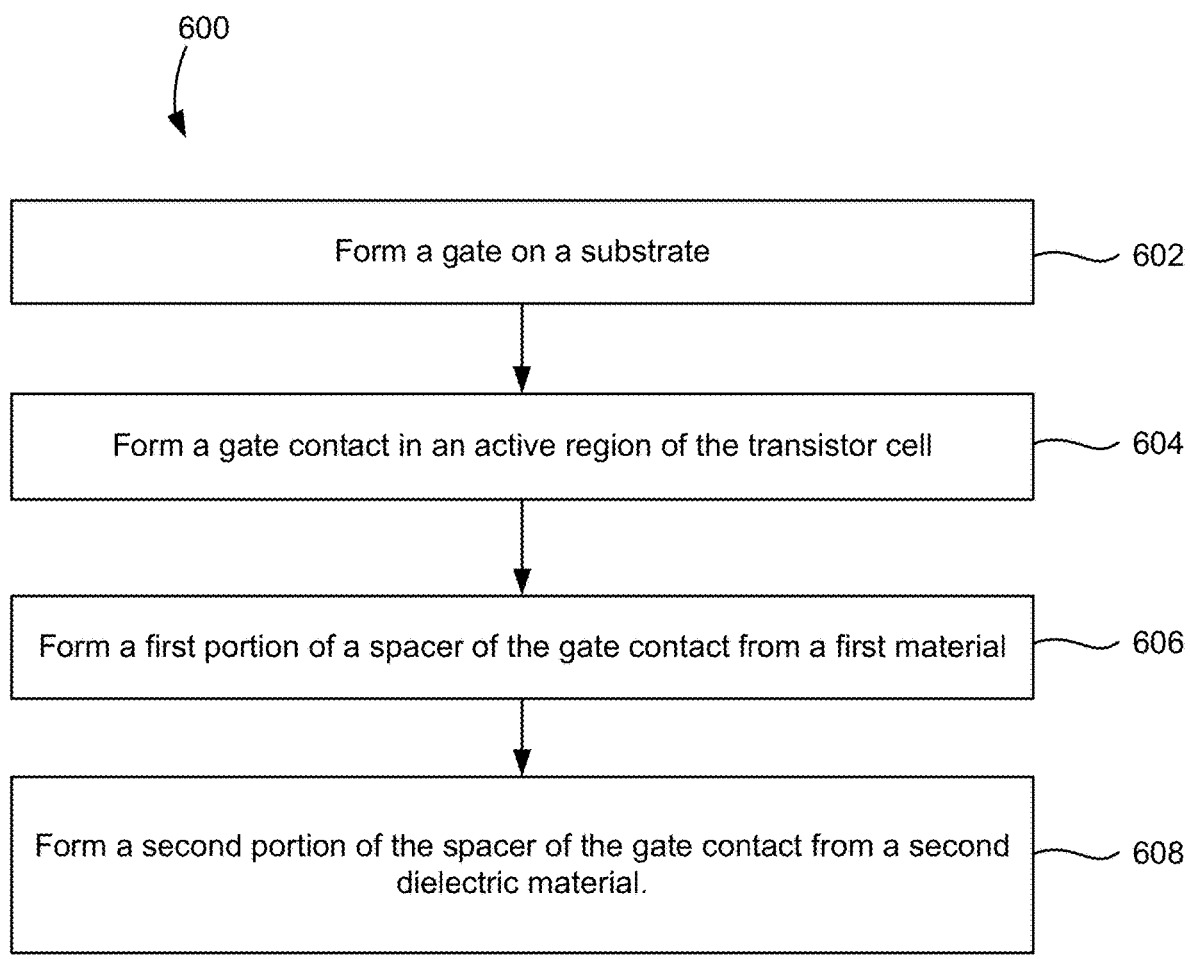
FIG. 6 illustrates a flow chart illustrating a method for a transistor cell in accordance with at least one aspect of the disclosure.

FIG. 6 illustrates a method 600 to manufacture or fabricate an exemplary transistor cell in accordance with at least one aspect of the disclosure. The method, in block 602, includes forming a gate on a substrate. The method, in block 604, includes forming a gate contact in an active region of the transistor cell. The method, in block 606, includes forming a first portion of a spacer of the gate contact from a first material. The method, in block 608, includes forming a second portion of the spacer of the gate contact from a second material.

It will be appreciated from the foregoing disclosure that additional processes for fabricating the various aspects disclosed herein will be apparent to those skilled in the art and a literal rendition of the processes discussed above will not be provided or illustrated in the included drawings.

Figure 7:
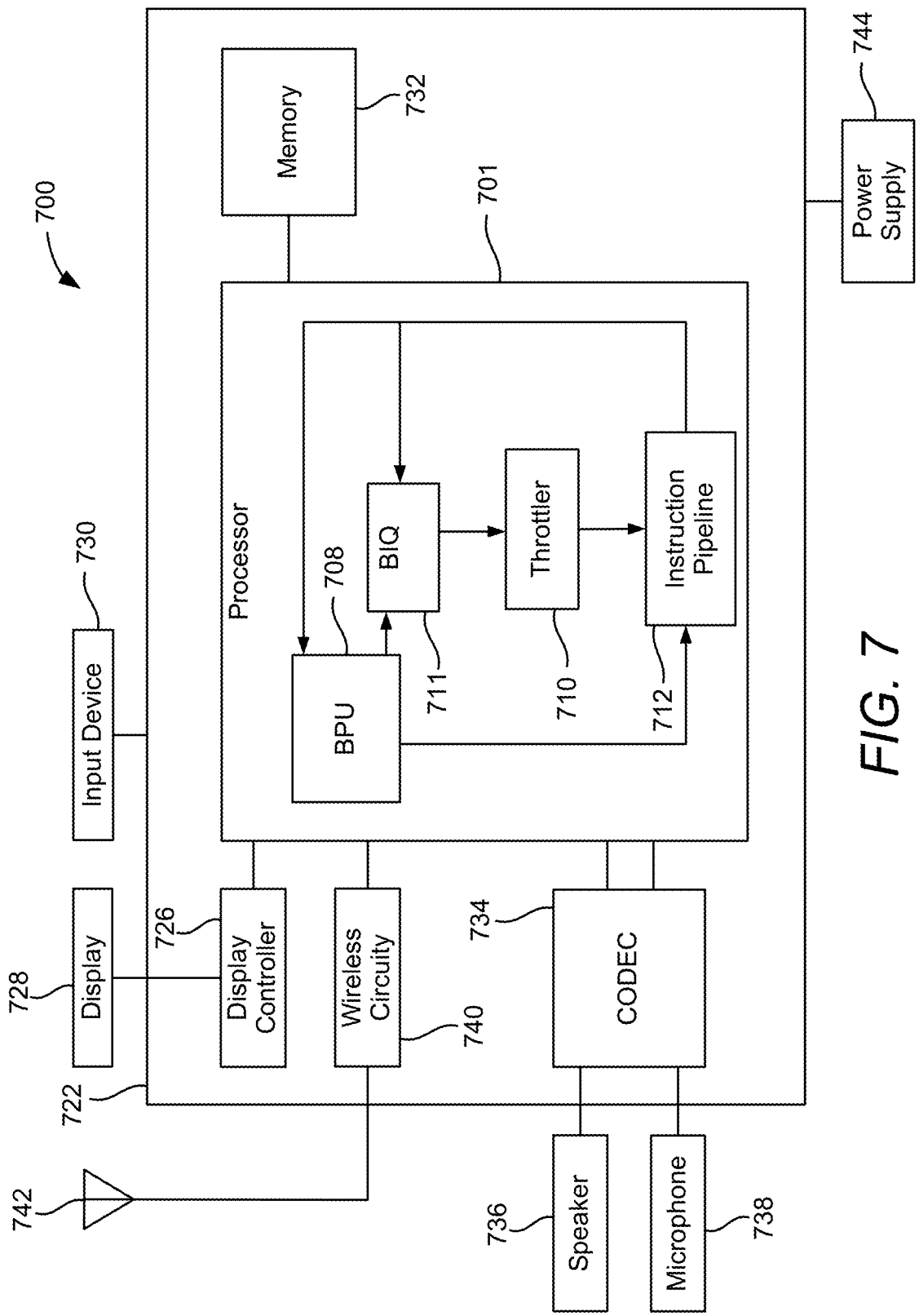
FIG. 7 illustrates a mobile device in accordance with some examples of the disclosure.

FIG. 7 illustrates an exemplary mobile device in accordance with some examples of the disclosure which may include transistor cells, as disclosed herein, in one or more components. Referring now to FIG. 7, a block diagram of a mobile device that is configured according to exemplary aspects is depicted and generally designated mobile device 700. In some aspects, mobile device 700 may be configured as a wireless communication device. As shown, mobile device 700 includes processor 701, which may be configured to implement the methods described herein in various aspects. Processor 701 is shown to comprise instruction pipeline 712, buffer processing unit (BPU) 708, branch instruction queue (BIQ) 711, and throttler 710 as is well known in the art. Other well-known details (e.g., counters, entries, confidence fields, weighted sum, comparator, etc.) of these blocks have been omitted from this view of processor 701 for the sake of clarity.

Processor 701 may be communicatively coupled to memory 732 over a link, which may be a die-to-die or chip-to-chip link. Mobile device 700 also include display 728 and display controller 726, with display controller 726 coupled to processor 701 and to display 728.

In some aspects, FIG. 7 may include coder/decoder (CODEC) 734 (e.g., an audio and/or voice CODEC) coupled to processor 701; speaker 736 and microphone 738 coupled to CODEC 734; and wireless controller 740 (which may include a modem) coupled to wireless antenna 742 and to processor 701.

In one particular aspect, where one or more of the above-mentioned blocks are present, processor 701, display controller 726, memory 732, CODEC 734, and wireless controller 740 can be included in a system-in-package or system-on-chip device 722. Input device 730 (e.g., physical, or virtual keyboard), power supply 744 (e.g., battery), display 728, input device 730, speaker 736, microphone 738, wireless antenna 742, and power supply 744 may be external to system-on-chip device 722 and may be coupled to a component of a system-on-chip device.

It should be noted that although FIG. 7 depicts a mobile device, processor 701 and memory 732 may also be integrated into a set top box, a music player, a video player, an entertainment unit, a navigation device, a personal digital assistant (PDA), a fixed location data unit, a computer, a laptop, a tablet, a communications device, a mobile phone, server, an access point, a base station, or other similar devices.

Figure 8:
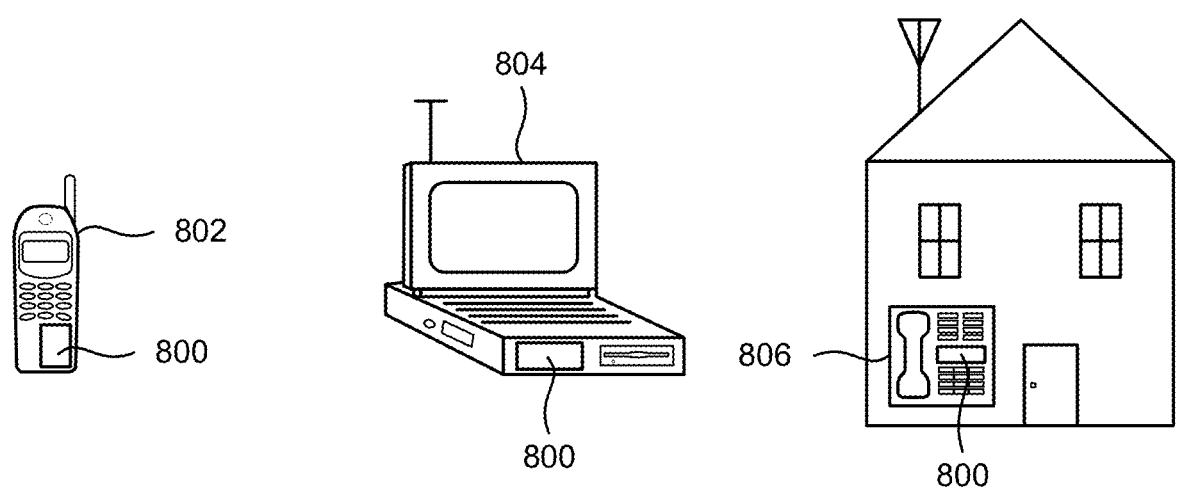
FIG. 8 illustrates various electronic devices that include transistor cells in accordance with the aforementioned aspects.

FIG. 8 illustrates various electronic devices that may be integrated with any of the aforementioned transistor cells in accordance with some examples of the disclosure. For example, a mobile phone device 802, a laptop computer device 804, and a fixed location terminal device 806 may include a semiconductor device 800 including the various transistor cells (e.g., 100, 200, 300 and 400) as described herein. The semiconductor device 800 may be, for example, integrated circuits, dies, integrated devices, integrated device packages, integrated circuit devices, packages, integrated circuit packages, or package-on-package devices. The devices 802, 804, and 806 illustrated in FIG. 8 are merely exemplary. Other electronic devices may also feature the semiconductor device 800 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

The foregoing disclosed devices and functionalities may be designed and configured into computer files (e.g., register-transfer level (RTL), Geometric Data Stream (GDS) Gerber, and the like) stored on computer-readable media. Some or all such files may be provided to fabrication handlers who fabricate devices based on such files. Resulting products may include semiconductor wafers that are then cut into semiconductor die and packaged into semiconductor packages, integrated devices, system-on-chip devices, and the like, which may then be employed in the various devices described herein.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

One or more of the components, processes, features, and/or functions illustrated in FIGS. 1-8 may be rearranged and/or combined into a single component, process, feature, or function or incorporated in several components, processes, or functions. Additional elements, components, processes, and/or functions may also be added without departing from the disclosure. It should also be noted that FIGS. 1-8 and corresponding description in the present disclosure are not limited to dies and/or ICs. In some implementations, FIGS. 1-8 and the corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and the like.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an insulator and a conductor). Furthermore, it is also intended that aspects of a clause can be included in any other independent clause, even if the clause is not directly dependent on the independent clause.

Implementation examples are described in the following numbered clauses:

Clause 1. An apparatus comprising a transistor cell, the transistor cell comprising: a substrate; an active region; a gate having a gate contact in the active region; a first portion of a spacer of the gate contact formed from a first material; and a second portion of the spacer of the gate contact formed from a second material.

Clause 2. The apparatus of clause 1, wherein the first material comprises at least one of Aluminum Oxide (AlOx), Aluminum Nitride (AlN), Titanium Oxide (TiOx), Titanium Nitride (TiN) or Silicon Carbide (SiC).

Clause 3. The apparatus of any of clauses 1 to 2, wherein the second material comprises Silicon Oxycarbide (SiOC) or Silicon Boron Carbon Nitride (SiBCN).

Clause 4. The apparatus of any of clauses 1 to 3, wherein a thickness of the first material is substantially equal to a thickness of the second material.

Clause 5. The apparatus of clause 4, wherein the thickness of the first material is in a range of 5 nanometers (nm) to 15 nm.

Clause 6. The apparatus of any of clauses 1 to 5, wherein a height of the first portion of the spacer of the gate contact is smaller than a height of the second portion of the spacer of the gate contact.

Clause 7. The apparatus of clause 6, wherein the height of the first portion of the spacer of the gate contact is in a range of 10 nm to 20 nm.

Clause 8. The apparatus of any of clauses 1 to 7, wherein the transistor cell further comprises: a source region having a source contact; a drain region having a drain contact, wherein the source contact and the drain contact are adjacent the gate contact and on opposite sides of the gate contact; and an insulation layer disposed on the substrate, between the spacer of the gate contact and the source contact, and between the spacer of the gate contact and the drain contact.

Clause 9. The apparatus of clause 8, wherein the insulation layer comprises Silicon Dioxide ($SiO_2$) and the gate contact, the source contact, and the drain contact comprise at least one of Cobalt (Co) or Tungsten (W).

Clause 10. The apparatus of any of clauses 1 to 9, wherein the spacer of the gate contact comprises a first sidewall and a second sidewall disposed on opposite sides of the gate and wherein each sidewall has a first portion formed from the first material and a second portion formed from the second material.

Clause 11. The apparatus of any of clauses 1 to 10, wherein the transistor cell further comprises: a second gate having a second gate contact; a second spacer of the second gate contact comprising a first sidewall and a second sidewall disposed on opposite sides of the second gate, wherein each sidewall of the second spacer has a first portion formed from the first material and a second portion formed from the second material; a third gate having a third gate contact, wherein the second gate and the third gate are on opposite sides of the gate; and a third spacer of the third gate contact comprising a first sidewall and a second sidewall disposed on opposite sides of the third gate, wherein each sidewall of the third spacer has a first portion formed from the first material and a second portion formed from the second material.

Clause 12. The apparatus of any of clauses 1 to 10, wherein the transistor cell further comprises: a second gate having a second gate contact; a second spacer of the second gate contact comprising a first sidewall and a second sidewall disposed on opposite sides of the second gate, wherein the first sidewall faces the gate and has a first portion formed from the first material and a second portion formed from the second material and wherein the second sidewall is formed from the second material; a third gate having a third gate contact, wherein the second gate and the third gate are on opposite sides of the gate; and a third spacer of the third gate contact comprising a first sidewall and a second sidewall disposed on opposite sides of the third gate, wherein the first sidewall faces the gate and has a first portion formed from the first material and a second portion formed from the second material and wherein the second sidewall is formed from the second material.

Clause 13. The apparatus of any of clauses 1 to 12, wherein the apparatus is selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

Clause 14. A method for manufacturing a transistor cell comprising: forming a gate contact on a substrate; forming a gate contact in an active region of the transistor cell; forming a first portion of a spacer of the gate contact from a first material; and forming a second portion of the spacer of the gate contact from a second material.

Clause 15. The method of clause 14, wherein the first material comprises at least one of Aluminum Oxide (AlOx), Aluminum Nitride (AlN), Titanium Oxide (TiOx), Titanium Nitride (TiN) or Silicon Carbide (SiC).

Clause 16. The method of any of clauses 14 to 15, wherein the second material comprises Silicon Oxycarbide (SiOC) or Silicon Boron Carbon Nitride (SiBCN).

Clause 17. The method of any of clauses 14 to 16, wherein a thickness of the first material is substantially equal to a thickness of the second material.

Clause 18. The method of clause 17, wherein the thickness of the first material is in a range of 5 nanometers (nm) to 15 nm.

Clause 19. The method of any of clauses 14 to 18, wherein a height of the first portion of the spacer of the gate contact is smaller than a height of the second portion of the spacer of the gate contact.

Clause 20. The method of clause 19, wherein the height of the first portion of the spacer of the gate contact is in a range of 10 nm to 20 nm.

Clause 21. The method of any of clauses 14 to 20, further comprising: forming a source region having a source contact; forming a drain region having a drain contact, wherein the source contact and the drain contact are adjacent the gate contact and on opposite sides of the gate contact; and depositing an insulation layer on the substrate, between the spacer of the gate contact and the source contact, and between the spacer of the gate contact and the drain contact.

Clause 22. The method of clause 21, wherein the insulation layer comprises Silicon Dioxide ($SiO_2$) and the gate contact, the source contact, and the drain contact comprise at least one of Cobalt (Co) or Tungsten (W).

Clause 23. The method of any of clauses 14 to 22, wherein the spacer of the gate contact comprises a first sidewall and a second sidewall disposed on opposite sides of the gate and wherein each sidewall has a first portion formed from the first material and a second portion formed from the second material.

Clause 24. The method of any of clauses 14 to 23, further comprising: forming a second gate having a second gate contact; forming a second spacer of the second gate contact comprising a first sidewall and a second sidewall disposed on opposite sides of the second gate, wherein each sidewall of the second spacer has a first portion formed from the first material and a second portion formed from the second material; forming a third gate having a third gate contact, wherein the second gate and the third gate are on opposite sides of the gate; and forming a third spacer of the third gate contact comprising a first sidewall and a second sidewall disposed on opposite sides of the third gate, wherein each sidewall of the third spacer has a first portion formed from the first material and a second portion formed from the second material.

Clause 25. The method of any of clauses 14 to 23, further comprising: forming a second gate having a second gate contact; forming a second spacer of the second gate contact comprising a first sidewall and a second sidewall disposed on opposite sides of the second gate, wherein the first sidewall faces the gate and has a first portion formed from the first material and a second portion formed from the second material and wherein the second sidewall is formed from the second material; forming a third gate having a third gate contact, wherein the second gate and the third gate are on opposite sides of the gate; and forming a third spacer of the third gate contact comprising a first sidewall and a second sidewall disposed on opposite sides of the third gate, wherein the first sidewall faces the gate and has a first portion formed from the first material and a second portion formed from the second material and wherein the second sidewall is formed from the second material.

Clause 26. The method of any of clauses 14 to 25, wherein the transistor cell is included in an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

In the detailed description above it can be seen that different features are grouped together in examples. This manner of the disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an insulator and a conductor). Furthermore, it is also intended that aspects of a clause can be included in any other independent clause, even if the clause is not directly dependent on the independent clause.

It will be appreciated that various aspects disclosed herein can be described as functional equivalents to the structures, materials and/or devices described and/or recognized by those skilled in the art. It should furthermore be noted that methods, systems, and apparatus disclosed in the description or in the claims can be implemented by a device comprising means for performing the respective actions of this method. It will be appreciated that the aspects discussed above are merely provided as examples and the various aspects claimed are not limited to the specific references and/or illustrations cited as examples.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wire line connection, or other connection, regardless of whether satellite signal reception, assistance data reception, and/or position-related processing occurs at the device or at the other device. In addition, these terms are intended to include all devices, including wireless and wire line communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wire line phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5 (both expressly incorporated herein in their entirety).

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage, or mode of operation. Furthermore, a particular feature and/or structure can be combined with one or more other features and/or structures. Moreover, at least a portion of the apparatus described hereby can be configured to perform at least a portion of a method described hereby.

It should be noted that the terms "connected", "coupled", or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. An apparatus comprising a transistor cell, the transistor cell comprising:
    a substrate;
    an active region;
    a gate having a gate contact in the active region;
    a first portion of a spacer of the gate contact formed from a first material;
    a second portion of the spacer of the gate contact formed from a second material,
    a source region having a source contact;
    a drain region having a drain contact, wherein the source contact and the drain contact are adjacent the gate contact and on opposite sides of the gate contact; and
    an insulation layer disposed on the substrate, between the spacer of the gate contact and the source contact, and between the spacer of the gate contact and the drain contact,
    wherein top surfaces of the gate contact and the first portion are coplanar, and
    wherein the source region and the drain region are formed at least partially in the substrate and at least partially in the insulation layer, and the source region and the drain region do not extend entirely up to the top surfaces of the gate contact and the first portion within the insulation layer.

2. The apparatus of claim 1, wherein the first material comprises at least one of Aluminum Oxide (AlOx), Aluminum Nitride (AlN), Titanium Oxide (TiOx), Titanium Nitride (TiN), or Silicon Carbide (SiC).

3. The apparatus of claim 1, wherein the second material comprises Silicon Oxycarbide (SiOC) or Silicon Boron Carbon Nitride (SiBCN).

4. The apparatus of claim 1, wherein a thickness of the first material is substantially equal to a thickness of the second material.

5. The apparatus of claim 4, wherein the thickness of the first material is in a range of 5 nanometers (nm) to 15 nm.

6. The apparatus of claim 1, wherein a height of the first portion of the spacer of the gate contact is smaller than a height of the second portion of the spacer of the gate contact.

7. The apparatus of claim 6, wherein the height of the first portion of the spacer of the gate contact is in a range of 10 nm to 20 nm.

8. The apparatus of claim 1, wherein the insulation layer comprises Silicon Dioxide ($SiO_2$) and the gate contact, the source contact, and the drain contact comprise at least one of Cobalt (Co) or Tungsten (W).

9. The apparatus of claim 1, wherein the spacer of the gate contact comprises a first sidewall and a second sidewall disposed on opposite sides of the gate and wherein each sidewall has a first portion formed from the first material and a second portion formed from the second material.

10. The apparatus of claim 1, wherein the transistor cell further comprises:
    a second gate having a second gate contact;
    a second spacer of the second gate contact comprising a first sidewall and a second sidewall disposed on opposite sides of the second gate, wherein each sidewall of the second spacer has a first portion formed from the first material and a second portion formed from the second material;
    a third gate having a third gate contact, wherein the second gate and the third gate are on opposite sides of the gate; and
    a third spacer of the third gate contact comprising a first sidewall and a second sidewall disposed on opposite sides of the third gate, wherein each sidewall of the third spacer has a first portion formed from the first material and a second portion formed from the second material.

11. The apparatus of claim 1, wherein the transistor cell further comprises:
    a second gate having a second gate contact;
    a second spacer of the second gate contact comprising a first sidewall and a second sidewall disposed on opposite sides of the second gate, wherein the first sidewall faces the gate and has a first portion formed from the first material and a second portion formed from the second material and wherein the second sidewall is formed from the second material;
    a third gate having a third gate contact, wherein the second gate and the third gate are on opposite sides of the gate; and a third spacer of the third gate contact comprising a first sidewall and a second sidewall disposed on opposite sides of the third gate, wherein the first sidewall faces the gate and has a first portion formed from the first material and a second portion formed from the second material and wherein the second sidewall is formed from the second material.

12. The apparatus of claim 1, wherein the apparatus is selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

13. The apparatus of claim 1, wherein top surfaces of the gate contact, the first portion, and the insulation layer are coplanar.

* * * * *